(12) United States Patent
Kim

(10) Patent No.: US 6,676,803 B2
(45) Date of Patent: Jan. 13, 2004

(54) SEMICONDUCTOR DEVICE FABRICATING EQUIPMENT USING RADIO FREQUENCY ENERGY

(75) Inventor: Jong Hee Kim, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 102 days.

(21) Appl. No.: 10/036,455

(22) Filed: Jan. 7, 2002

(65) Prior Publication Data
US 2002/0189762 A1 Dec. 19, 2002

(30) Foreign Application Priority Data
Jun. 14, 2001 (KR) .......................... 2001-33475

(51) Int. Cl.[7] .............................................. H01L 21/00
(52) U.S. Cl. ........................... 156/345.47; 156/345.43; 118/723 E
(58) Field of Search ....................... 156/345.47, 345.43, 156/345.44, 916; 118/723 E, 715

(56) References Cited

U.S. PATENT DOCUMENTS

| | | | | |
|---|---|---|---|---|
| 4,908,095 A | * | 3/1990 | Kagatsume et al. | 156/643 |
| 5,641,375 A | * | 6/1997 | Nitescu et al. | 156/345.43 |
| 5,755,886 A | * | 5/1998 | Wang et al. | 118/715 |
| 5,885,356 A | * | 3/1999 | Zhao et al. | 118/723 ER |
| 5,964,947 A | * | 10/1999 | Zhao et al. | 118/715 |
| 5,972,114 A | * | 10/1999 | Yonenaga et al. | 118/715 |
| 6,129,808 A | * | 10/2000 | Wicker et al. | 156/345.43 |
| 6,170,429 B1 | * | 1/2001 | Schoepp et al. | 118/723 R |
| 2001/0035132 A1 | * | 11/2001 | Kent et al. | 118/733 |

FOREIGN PATENT DOCUMENTS

JP 08335568 A * 12/1996 ....... H01L/21/3065

* cited by examiner

Primary Examiner—Gregory Mills
Assistant Examiner—Michelle Crowell

(57) ABSTRACT

A semiconductor device fabricating equipment using radio frequency energy is capable of preventing a wafer from being polluted by various kinds of polymers deposited indiscriminately on the respective portions within a chamber, having a housing which divides and forms the inside such that an upper electrode part applying the radio frequency energy is in an upper side thereof, a chuck assembly which applies the radio frequency energy, fixes a provided wafer, and is installed so as to ascend and descend, opposite to the upper electrode part inside the housing, and a baffle plate which is fixingly-installed onto an inner wall of the housing so that an inner side edge portion is positioned adjacent to a side wall of the chuck assembly with a given space therebetween. The baffle plate is fixed and installed onto the inner wall of the housing, and an outer side shape of the ascending/descending-driven chuck assembly is formed simply. Accordingly, the effect of an eddy flow phenomenon caused by the ascending/descending-driving of the chuck assembly is reduced, and a wafer is prevented from being polluted and damaged by controlling a flow of polymer which reacts as a particle on the wafer.

7 Claims, 2 Drawing Sheets

SEMICONDUCTOR DEVICE FABRICATING EQUIPMENT USING RADIO FREQUENCY ENERGY

CROSS-REFERENCES TO RELATED APPLICATIONS

This application claims benefit of Korean Patent Application No. 2001-33475, filed on Jun. 14, 2001 in the name of Jong-Hee Kim, the entirety of which is hereby incorporated by reference for all purposes as if fully set forth herein.

BACKGROUND OF THE INVENTION

1. Field of the Invention

The present invention relates to semiconductor device fabricating equipment using radio frequency energy, and more particularly, to semiconductor device fabricating equipment using radio frequency energy which is capable of preventing a chamber's respective portions containing a wafer from being polluted and damaged by various kinds of polymers deposited indiscriminately on the respective portions within the chamber.

2. Discussion of Related Art

In general, a semiconductor device is obtained by selectively and repetitively performing such processes as photolithography, etching, diffusion, chemical vapor deposition, ion injection and metallic depositions etc. on a wafer.

In semiconductor device fabricating equipment performing processes such as the etching, diffusion, chemical vapor deposition and metallic deposition, etc., the process is performed by converting a supplied process gas, through the use of radio frequency energy, into a plasma state, and by causing it to react on an upper surface of a wafer, or on a portion exposed from a pattern mask.

In such processes procedures of the semiconductor device fabricating equipment, a residual product, namely, polymer, is generated by a reaction of the process gas, and these polymers are consecutively deposited on an overall area provided under the processes, thus causing an obstruction in the process and, in the case that the polymer comes out of its deposited surface and moves onto the wafer, further reacting as a particle which causes a defect.

Before describing such polymer's deposition relation and its influence, a conventional technical configuration of the semiconductor device fabricating equipment using the radio frequency energy will be described with reference to the accompanied drawings.

Figure 1:
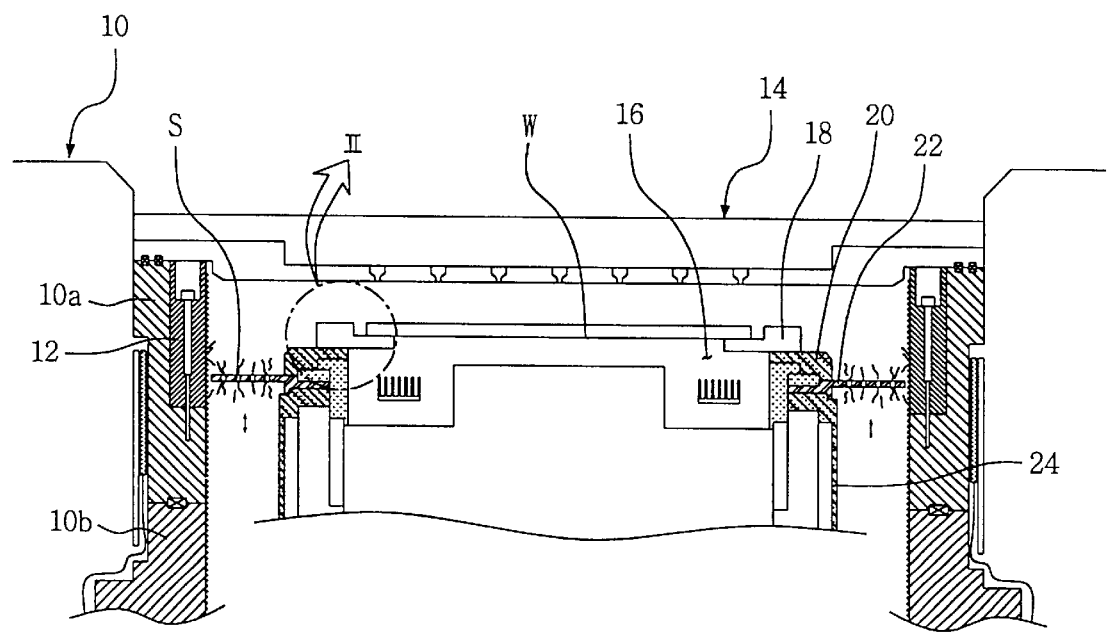

As shown in FIG. 1, in the conventional construction of the semiconductor device fabricating equipment using the radio frequency energy, there is a housing 10 which divides a given space, and an inner wall portion of this housing 10 is also divided into an upper housing 10a and a lower housing 10b, and these upper and lower housings 10a, 10b are formed as a fixing structure connected to another construction.

In the inner wall of the upper housing 10a, a shield 12 for covering a given area of the inner wall in the vertical direction is installed so that polymer P generated in the process procedure is not deposited on the inner wall of the upper housing 10a.

Further, on an opened top of the housing 10, namely, an upper side ending portion of the upper housing 10a, an upper electrode part 14 is set, the upper electrode part 14 being assembled in a plate shape based on a constant thickness and applying the radio frequency energy. The inside of the upper and lower housings 10a, 10b have a closed atmosphere by the combination installation of the upper electrode part 14.

In the housing 10 beneath the upper electrode part 14, a chuck assembly is installed so as to be ascendible and descendible, the chuck assembly being for selectively fixing a provided and positioned wafer W and, containing a lower electrode part 16 which is confronted with the upper electrode part 14 and also applies the radio frequency energy.

Describing the construction of the chuck assembly more in detail, as shown in FIG. 1, in such a configuration, an upper surface edge portion of the lower electrode part 16 for closely supporting a lower surface of the wafer W is placed at a given distance from and centered with respect to a lower surface edge portion of the wafer W, and an outer upper surface edge of the lower electrode part 16 forms a stepped shape, based on a given thickness from an upper surface to a lower surface.

Figure 2:
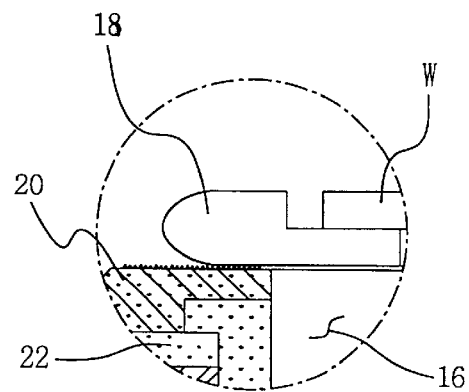

At this time, the lower electrode part 16 selectively absorption-fixes a lower surface of the wafer W close-supported on the upper face thereof by using static electricity force or vacuum pressure. As shown in FIG. 1 or FIG. 2, in the stepped portion of the lower electrode part 16, a focus ring 18 of a given shape is positioned so as to closely support a lower surface edge portion of the wafer W exposed by the upper surface of the lower electrode part 16, wherein the focus ring 18 is made of material the same as, or similar to, the wafer W and enlarges a distribution area so that the wafer W is positioned in a central portion of a radio frequency energy area from the lower electrode part 16.

Additionally, an insulation ring 20 for supporting a lower surface portion of the focus ring 18 is installed on an outer wall of the lower electrode part 16, extended and projected from the outside of the stepped portion of the lower electrode part 16. In a lower side portion of this insulation ring 20, a baffle plate 22, having numerous slits S formed therein, is set to control flow of the polymer into a lower part of the housing 10, the polymer being generated in the midst of executing the processes.

An outer ending portion of such installed baffle plate 22 is provided as a state closely positioned to an inner wall of the upper and lower housings 10, 10b with a given interval therebetween. In a lower portion of the baffle plate 22, a support member 24, made of dielectric material, is installed so as to shield a lower side portion of the chuck assembly containing the lower electrode part 16 from deposition of the polymer, and the baffle plate 22 is supported by an upper face of the support member 24.

Accordingly, during a process, the baffle plate 22 is positioned so as to ascend and descend by a driving of the chuck assembly so that an outer side portion of the baffle plate 22 becomes close to the side wall of the upper and lower housings 10, 10b.

Describing the progression of a process in the above construction, when the wafer W is provided inside the housing 10 and is adhesion-fixed to an upper part of the chuck assembly, namely, an upper surface of the lower electrode part 16 and an inner portion of the upper surface of the focus ring 18, the chuck assembly is driven to ascend/descend so that an upper surface of the wafer becomes near to the upper electrode part 14 with a given interval therebetween.

The process gas is supplied into a gap between the upper and lower electrode parts 14, 16, namely, an upper side of the wafer W from a given side portion of the housing 10. Under such condition, when the radio frequency energy is applied to the upper and lower electrode parts 14, 16, the process gas provided therebetween is converted into a plasma state.

The process gas converted into plasma state reacts on an overall upper surface of the wafer W, or on a portion exposed from a formed photoresist pattern mask.

However, polymers in various forms or shapes generated by the above-mentioned reaction are indiscriminately deposited on the whole exposed area inside the housing 10, and such polymers' deposition thickness gradually becomes serious by continuous or repetitive process execution. In other words, the polymer becomes in a state in which it may easily be separated from the surface inside the housing, and when this detached polymer flows inside the housing 10 and is positioned on the surface of the wafer W, the polymer reacts as a particle which causes a defect, etc.

Describing such problems on the polymer more in detail as shown in FIG. 2, it can be first seen that a hard polymer is continuously penetrated and deposited on the chuck assembly, despite a gap between the focus ring 18 and the insulation ring 20 for supporting a lower part of the focus ring 18 being under a close-stuck and covered state.

Such polymer deposited in the gap between the focus ring 18 and the insulation ring 20 degrades a function of the focus ring 18 in which the plasma area distribution on the wafer W is formed uniformly. Furthermore, such deposited polymer makes the wafer W loosened from the lower electrode part 16, or twisted, together with the focus ring 18.

This causes a process degradation such that a central portion of the wafer W is changed to a concave state by a fixing force of the lower electrode part 16, or that one side portion of the wafer W becomes loose; namely, the process on the wafer W is not executed equally.

Further, an outer portion of the focus ring 18 of the materials the wafer W, or a similar material, is gradually etched by the continuous process, and is changed to a radicalized shape, and guides the plasma area unequally, to thus again degrade the process.

Meanwhile, as that the baffle plate 22 is fixed to, and extending outward from, the chuck assembly, together with the chuck assembly it is driven to ascend/descend in a state where it is positioned adjacent to the inner wall of the upper and lower housing 10a, 10b. However, this causes an eddy flow phenomenon in a slit (s) of the baffle plate 22, or in a gap between the inner walls of the upper and lower housings 10a, 10b, to thus separate the polymer from its surface such that it floats, the polymer being deposited on the baffle plate 22 or on the upper and lower housings 10a, 10b inner wall.

In case such floating and flowing polymer flows onto the upper face of the wafer W, the portion where it is deposited has such a defect as being polluted or damaged etc. as mentioned above.

Further, the baffle plate 22 has a severe temperature change or deflection due to the process progression and stand-by time. Accordingly, the deposited polymer exists in a state where it easily breaks away. In other words, in case there is the eddy flow phenomenon in the ascending/descending driving of the chuck assembly as mentioned above, the polymer deposited on the surface is in a state such that it is easily separated therefrom and easily flows.

In the construction of the housing 10, the shield 12 is installed so as to cover only a given upper area portion of the upper housing 10a, and accordingly, a lower inner wall portion of the upper housing 10a and an inner wall portion of the lower housing 10b are exposed in the deposition of the polymer.

The polymer deposited on the shield 12 and the upper and lower housings 10a, 10b has a hard nature. Thus, the shield 12 can be separated from the upper housing 10a, be cleansed, and after that, can be reassembled. Therefore, its use may be easy. However, the upper and lower housings 10a, 10b are mutually combined with other constructions for assisting the process inside of the housing 10, and thus their separation and assembly are difficult. Also, since after a cleansing, their reassembly requires precision, there is a difficulty in a reassembly, and manpower, a lot of working time, and the careful attention of a worker are further required.

SUMMARY OF THE INVENTION

Accordingly, the present invention is directed to semiconductor device fabricating equipment using radio frequency energy that substantially obviates one or more of the limitations and disadvantages of the related art.

A primary object of the present invention is to provide semiconductor device fabricating equipment using radio frequency energy, in which a uniform distribution and process on a plasma area can be uniformly gained by preventing an edge portion of a focus ring from being etched in a radicalized shape, thereby maintaining a fixed disposition state of the focus ring and a wafer, and consequently a process can be obtained stably and uniformly, by preventing deposition of a polymer between the focus ring and an insulation ring.

Another object of the present invention is to provide semiconductor device fabricating equipment using radio frequency energy which is capable of simplifying each configuration corresponding to an ascending and descending driving of a chuck assembly, restricting an eddy flow phenomenon based on a flowing of a polymer and a particle at maximum, to thereby prevent a flowing of the polymer deposited on each surface inside of a housing and also to prevent a wafer defect containing pollution, or a damage to a wafer.

Still another object of the present invention is to provide a semiconductor device fabricating equipment using radio frequency energy, in which upper and lower housings are protected from a polymer being deposited indiscriminately, wherein disassembly and assembly of respective constructive components inside the housing are easy, to shorten the working time for equipment restoration and to increase the operation rate of the equipment, and a stabilize productivity.

To achieve these and other advantages, and in accordance with the purpose of the present invention, a semiconductor device fabricating equipment using radio frequency energy is composed of a housing which divides and forms the inside according that an upper electrode part having an applying of radio frequency energy is combined from an upper side thereof; a chuck assembly which has an applying of the radio frequency energy, fixes a provided wafer, and is installed so as to ascend and descend, oppositely to the upper electrode part, in the housing inside; and a baffle plate which is fixing-installed onto an inner wall of the housing so that an inner side edge portion is adjacent-positioned on a side wall of the chuck assembly with a given interval.

Further, it is desirable that the inner wall portion of the housing is divided into an upper housing and a lower housing, and that the baffle plate is fixingly-installed on a given portion of the upper housing's upper side.

It is also desirable in the installation of the baffle plate that a shape of the upper housing inner wall has the shape of a short jaw extended and projected from a lower direction's given position of an upper part to an inner side, and the baffle plate is preferably installed to be put on and supported by an upper part of the short jaw of the upper housing.

In addition, it is desirable to insert and install a shield having a tubular, or cylindrical, shape on the ledge of the upper housing so as to closely cover an inner wall of the upper housing.

Furthermore, in an inner wall of the lower housing containing a lower side inner wall from a short jaw position of the upper housing, it is set a liner having a tubular, or cylindrical, shape bent outwards so that its upper ending portion is put on an upper surface of the short jaw, to thus cover the surface thereof, and the baffle plate is positioned to be closely supported by the bent upper ending portion of the liner. Further, the shield is installed in a shape pressurizing and fixing an outer edge portion of the baffle plate, to thus fasten the shield, upper ending portions of its contacting and corresponding baffle plate and liner, and a short jaw portion of the upper housing by piercing a fastening instrument through them.

Meanwhile, the chuck assembly is constructed of: a lower electrode part, which closely supports a center portion of a lower surface of a positioned wafer, and which has a stepped shape so that an upper surface edge portion thereof is separated from a lower surface of the wafer; a focus ring whose inner lower surface is closely supported within a stepped surface of the lower electrode part, and whose inner upper surface portion has a stepped shape so that a lower surface of the wafer is inserted from above and stably positioned; and an insulation ring having a ring shape extended and projected outwards from a side part of the lower electrode part, wherein an inner upper surface portion of the insulation ring has a stepped shape so that a lower surface circumferential portion of the focus ring is inserted from above and is stably positioned.

The stepped portion of the insulation ring may be formed in a shape closely corresponding to an outer side wall of the focus ring and in a shape extended and projected therefrom. The inner upper surface of the insulation ring contact corresponding to the focus ring is formed so as to be positioned below the stepped portion of the lower electrode part. A corresponding lower portion of the focus ring can be formed in a shape projected along an outer side of the stepped portion of the lower electrode part.

Also, the stepped portion of the insulation ring is preferably formed to a depth of 1.5~2.2 mm from an upper surface of its outer side portion, and the outer side portion of the insulation ring is preferably extension-formed to a lower side thereof so as to form a side wall adjacent to an inner side portion of the baffle plate.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention.

Figure 3:
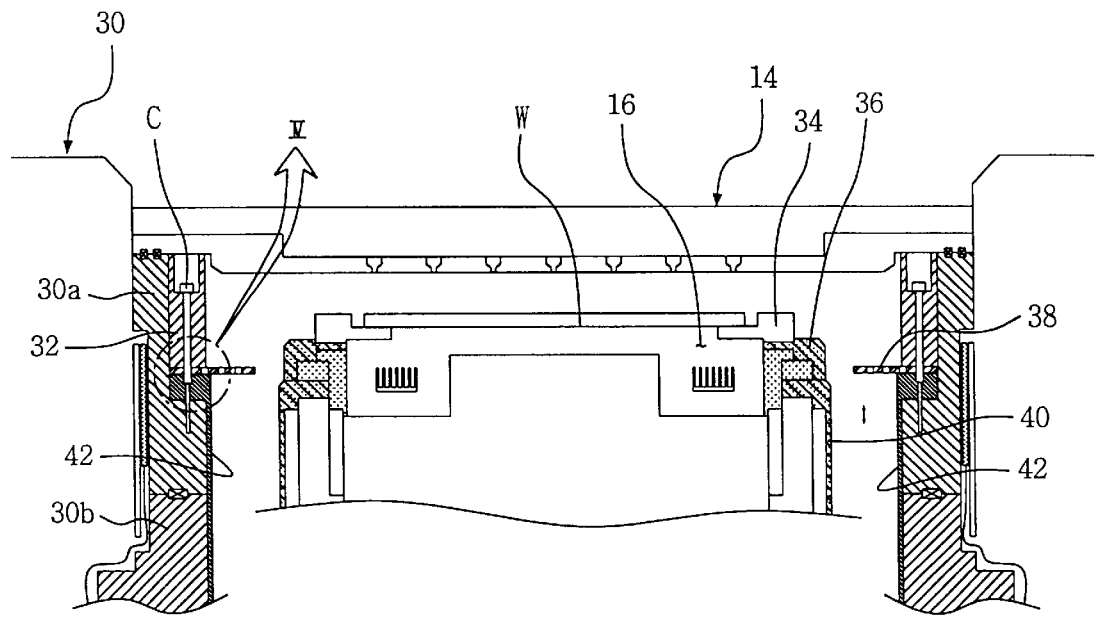
Figure 4:
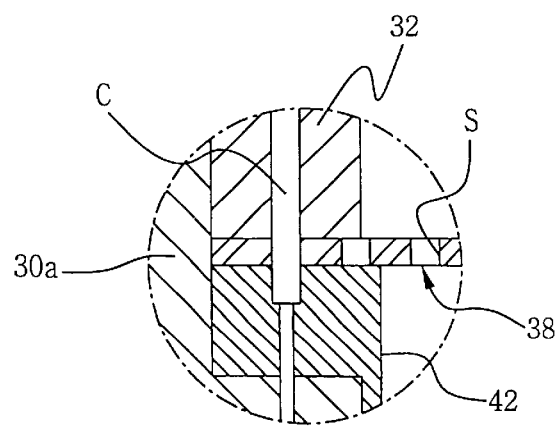

In the drawings: FIG. 1 illustrates a schematic sectional view of the construction of a conventional semiconductor device fabricating equipment using radio frequency energy;

FIG. 2 schematically depicts a partial sectional view of portion II shown in FIG. 1 showing change to a focus ring through a process progression;

FIG. 3 is a schematic sectional view showing the construction of a semiconductor device fabricating equipment using radio frequency energy, in one embodiment of the present invention; and FIG. 4 represents an enlarged schematic sectional view illustrating the construction of a portion of the semiconductor fabricating equipment shown in FIG. 3 as "IV".

DETAILED DESCRIPTION OF PREFERRED EMBODIMENT

Reference will now be made in detail to the preferred embodiments of the present invention, examples of which are illustrated in the accompanying drawings.

The construction of a semiconductor device fabricating equipment using radio frequency energy will be described referring to the accompanied drawings.

FIG. 3 is a schematic sectional view showing the construction of the semiconductor device fabricating equipment using the radio frequency energy in one embodiment of the present invention. FIG. 4 is a enlarged partially sectional view which shows the construction of a portion IV shown in FIG. 3, and which schematically shows a combination relation of respective constructive components partially. It will be noted that herewith, parts the same as for the conventional device of FIGS. 1 & 2 have the same reference numbers/characters, and their detailed description is therefore omitted.

In the construction of the semiconductor device fabricating equipment using the radio frequency energy in accordance with the present invention, as shown in FIG. 3, there is a housing 30 whose inside is divided in an upper part thereof by installing an upper electrode part 14 which is assembled in a plate shape based on a given thickness and which applies radio frequency energy, the housing 30 having an upper housing 30a and a lower housing 30b which are combined and connected with other constructive parts to form a fixing structure in an inner wall portion of the housing 30.

Inside the housing 30, a chuck assembly is installed, to which radio frequency energy corresponding to the upper electrode part 14 is applied. The chuck assembly fixes wafers W provided and positioned and is driven to ascend/descend in a direction confronting the upper electrode part 14.

Also, on a given position of the housing 30 inner wall, a baffle plate 38 having a plurality of slits S is fixed, and an inside edge portion of the baffle plate 38 is positioned so as to closely confront a side wall of the chuck assembly, with a given space therebetween.

Describing the installation and combination relation of respective constructive elements more in detail, the upper housing 30a has such a shape that a diameter of an inner wall provided in an upper portion is greater than a diameter of its lower portion, and its boundary portion forms a short jaw, or ledge, having a given width.

The thus-formed short jaw/ledge limits the positioning of the baffle plate 38 from the top thereof.

On top of the short jaw which supports the baffle plate 38, namely, in the corresponding inner wall of the upper housing 30a, a shield 32 having a tubular, or cylindrical, shape is positioned, and a lower side portion of the shield 32 is contacted with the baffle plate 38 under pressure so as to be fixed, the baffle plate 38 being supported by the short jaw.

As shown in FIG. 3 or 4, beneath the baffle plate 38 is installed a liner 42 having a tubular, or cylindrical, shape extending to a constant position of a lower part of the side wall of the lower housing 30b which holds or supports a lower side-wall portion of the upper housing 30a. An upper end portion of the liner 42 has a shape projected outward, or has a bent shape, so as to be closely supported by the ledge of the upper housing 30a.

Accordingly, on the side wall of the upper and lower housings 30a, 30b, is positioned the tubular-shaped liner 42 which is supported on the ledge or short jaw portion which is formed in the upper housing 30a, and which covers the side wall of the lower housing 30b holding the side wall of the upper housing 30a. An outer side portion of the baffle plate 38 contacts and is supported by an upper surface of this liner 42, and above the baffle plate 38, a tubular-shaped shield 32 is installed opposite to an inner wall of the upper housing 30a.

The shield 32, baffle plate 38 and liner 42 maintain their mutual pressurized and fixed state by using a fastening instrument C which pierces them from above to the short jaw portion of the upper housing 30a.

Meanwhile, as shown in FIG. 3 the chuck assembly is installed to selectively fix the wafer W provided in the housing 40 beneath the upper electrode part 14 so as to raise and lower the construction containing the lower electrode part 16 which applies the radio frequency energy.

Also, as described above, an edge portion of the upper surface of the lower electrode part 16 for closely supporting a lower surface of the wafer W, is positioned in the center of and a given distance from an edge portion of the lower surface of the wafer W. An outer edge portion of the upper surface of the lower electrode part 16 is formed in a stepped shape based on a constant thickness from an upper surface to a lower surface, and has a flat surface.

As shown in FIG. 3, in the stepped portion of the lower electrode part 16, a focus ring 34 of a given shape is positioned so as to closely support an edge portion of the lower surface of the wafer W, the bottom of the focus ring 34 being exposed by the stepped portion of the lower electrode part 16. The focus ring 34 is made of the same material as, or a similar material to, the wafer W and enlarges its distribution area so that the wafer W is positioned in a central portion of a radio frequency energy area.

In more detail, as shown in FIG. 3, the focus ring 34 has a ring shape and an inside portion of the upper surface of the focus ring 34 has a stepped shape so that the wafer W can be inserted a given depth from its top. The inside part of the stepped shape of the focus ring 34, and its lower surface, also form a shape closely positioned on the stepped portion of the lower electrode part 16.

Accordingly, in the wafer W positioned from above, a central portion of its lower surface closely contacts with an upper surface of the lower electrode 16, and at the same time an edge portion of the lower surface of the wafer W is also closely supported by the inside of the stepped portion of the upper surface of the focus ring 34, and is fixed by an absorption force through the use of static electricity force or vacuum pressure provided from the lower electrode part 16.

As shown in FIG. 3, an outer portion of the lower surface of the focus ring 34, namely, the portion projected from the outside of the stepped edge of the lower electrode part 16, is formed in a constant thickness in a shape extended and projected from a stepped portion of the lower electrode part 16, and thus it is installed in such a shape as to cover the stepped portion of the lower electrode part 16 of the focus ring 34 and a side wall of the stepped portion.

Further, as shown in FIG. 3, a lower side portion of the focus ring 34 is closely supported by an insulation ring 36 which is made of insulation material and which is installed in a ring shape projected in an outer direction from an upper side wall of the lower electrode part 16. At this time, an inner portion of the upper surface of the insulation ring 36 has a stepped shape which is deeper that a protruding outer portion of the lower surface of the focus ring 34.

Also, an outer portion of the lower surface of the insulation ring 36 has a shape more extended by an extent that the baffle plate 38 is positioned, in a lower side. Such a shape can be formed so as to be extended to a side wall lower portion of the chuck assembly containing the lower electrode part 16.

Therefore, as described above, an inside edge portion of the baffle plate 38 fixed on the side wall of the housing 30 closely corresponds to a side wall of the insulation ring 36 according to how the chuck assembly is ascendingly/descendingly-positioned.

Describing the progression of a process performed in such equipment, when the wafer W is provided into the inside of the housing 30 and is closely fixed onto an upper part of the chuck assembly, namely, an upper surface of the lower electrode part 16 and an inner stepped portion of an upper surface of the focus ring 34, the chuck assembly is driven to ascend/descend so that the upper surface of the wafer W becomes close to the upper electrode part 14 with a given distance therebetween.

Subsequently, process gas is supplied between the upper and lower electrode parts 14, 16 from a side part's constant portion of the housing 30, namely, to an upper side of the wafer W, and when under such state, the radio frequency energy is applied to the upper and lower electrode parts 14, 16, the process gas positioned therebetween is changed to a plasma state.

The process gas converted into the plasma state reacts on an overall upper surface of the wafer W, or on a portion exposed from a formed pattern mask.

In such a process, the focus ring 34 is inserted and installed into a gap between the stepped portion formed on the inside of an upper surface of the insulation ring 36 and the stepped portion side-wall of the lower electrode 16, to thereby prevent an invasion of generated polymer through the gap.

Accordingly, the focus ring 34 continuously maintains the close support state to the stepped portion of the insulation ring 36 and the stepped portion of the lower electrode part 16, to thus stably maintain a fixed position of the focus ring 34 and the wafer W, to prevent pollution and damage to the lower electrode part 16 caused through such portion, to prevent a radicalized formation on the focus ring's 34's outer side portion, and to simultaneously lead to obtaining a uniform process on the wafer W.

In addition, in the construction of the chuck assembly which is driven to ascend/descend inside the housing 30 wherein the baffle plate 38 is installed in the side wall of the housing 30 and an outer portion of the lower part of the insulation ring 36 is extended and formed, a side wall shape of the chuck assembly has such a simple shape that the ascending/descending process does not influence a flow of particles such as a neighboring polymer, etc.

This prevents the wafer W to be fabricated as a semiconductor device from being polluted and damaged by the polymer particles, etc., through the ascending/descending of the chuck assembly, and improves the fabrication yield of the semiconductor device.

Further, because the shield 32, the baffle plate 38 and the liner 42 cover the inner wall of the upper and lower housings 30a, 30b which are difficult to disassemble and assemble, the deposition of polymer thereon is prevented. In other words, pollution of respective constructive components containing the upper and lower housings 30a, 30b is prevented, and their life is lengthened. Further, their assembly, disassembly and cleansing are easy, and there is a reduction in the working time and labor required for equipment restoration, and also an improvement in an operation rate of the equipment and the productivity.

As mentioned above, in accordance with the present invention, a baffle plate is fixed and installed onto an inner wall of a housing, and an outer side shape of a chuck assembly driven to ascending/descend is formed simply. Thereby, there is an effect of reducing an eddy flow phenomenon caused by the ascending/descending-driving of the chuck assembly, and preventing a wafer from being polluted and damaged by controlling a flow of polymer which accordingly reacts as a particle.

In addition, in the construction wherein the baffle plate is fixed to the inner wall of the housing, the baffle plate forms a stabilized temperature state having a comparatively low temperature change, compared to a temperature change of the chuck assembly in a process having a period of time wherein radio frequency energy is a applied, and a stand-by time. That is, the polymer deposited on its surface has a hardening nature, which lessens the number of cases wherein the polymer is separated from the baffle plate and moves to the wafer, to thereby more stably prevent pollution and damage of the wafer.

In addition, the baffle plate is easy to disassemble and assemble, together with the above-mentioned shield and liner, and this shield, baffle plate and liner prevent pollution of the housing and have a structure capable of being easily cleansed and easily reassembled. Accordingly, the time required for disassembly and assembly of the equipment is reduced, and the operating rate and productivity of the equipment are improved.

Furthermore, an edge portion of a focus ring is prevented from developing a radicalized shape caused by radio frequency energy and process gas by the construction wherein the edge portion of the focus ring is partially inserted into and positioned in an insulation ring. Therefore, a plasma area is uniformly distributed, and simultaneously, a uniform process is obtained, and a fixed disposition state of the focus ring and wafer and the process can be stably obtained.

It will be apparent to those skilled in the art that various controls and variations can be made in the present invention without deviating from the spirit or scope of the invention. Thus, it is intended that the present invention cover the controls and variations of this invention provided they come within the scope of the appended claims and their equivalents.

What is claimed is:

1. A semiconductor device fabricating equipment using radio frequency energy, comprising:
    a housing having an upper electrode part in an upper portion thereof, the upper electrode applying the radio frequency energy, said housing including a ledge located between a top and bottom thereof extending from an inner wall of said housing to an interior of said housing;
    a chuck assembly which applies the radio frequency energy, fixes a provided wafer, and is installed so as to ascend and descend, opposite to the upper electrode part, inside the housing;
    a baffle plate which is fixed to an inner wall of the housing so that an inner side edge portion of said baffle plate is positioned adjacent to a side wall of the chuck assembly with a given distance therebetween, wherein the baffle plate is installed on and is supported by the ledge;
    a shield installed on the ledge, said shield having a tubular shape closely covering an inner wall of the housing;
    a tubular shaped liner extending down from the ledge of said housing and covering a surface of an inner wall of the housing, said liner having a bent upper end portion extending on the ledge, said baffle plate being positioned to be closely supported by the bent upper end portion of the liner, and said shield being installed in a form pressurizing and fixing an outer edge portion of the baffle plate; and
    a fastening instrument fastening the shield, the upper end portion of the liner, and the baffle plate on the ledge of the upper housing by piercing through them from an upper side thereof.

2. The equipment of claim 1, wherein said chuck assembly includes:
    a lower electrode closely supporting a center portion of a lower surface of the wafer, an upper surface of the lower electrode part having a stepped shape so that an edge portion thereof confronts and is spaced apart from a lower surface of the wafer;
    a focus ring whose inner lower surface face is closely supported by the stepped shaped upper surface of the lower electrode, and whose inner upper face portion has a stepped shape so that a lower face of the wafer is inserted above and stably positioned thereon; and
    an insulation ring having a ring shape extended and projected outward from a side part of the lower electrode, an inner upper surface portion of said insulation ring having a stepped shape so that a lower face circumferential portion of the focus ring is inserted above and is stably positioned thereon.

3. The equipment of claim 2, wherein the stepped portion of said insulation ring is formed in a shape closely corresponding to an outer side wall of the focus ring.

4. The equipment of claim 2, wherein an outer side portion of said insulation ring is extendedly formed so as to form a side wall adjacent to an inner side portion of the baffle plate.

5. The equipment of claim 1, wherein the wafer chuck assembly comprises:
    a lower electrode supporting a center portion of a lower surface of the wafer, an upper surface of the lower electrode part having a stepped shape; and
    a focus ring having an inner upper face portion on which a peripheral portion of a lower surface of the wafer is directly disposed.

6. The equipment of claim 2, wherein said housing includes a ledge between a top and bottom thereof extending from an inner wall of said housing to an interior of said housing, said equipment further comprising a fastener piercing the baffle plate and an upper surface of the ledge, and fixing the baffle plate to the ledge.

7. A semiconductor device fabricating equipment using radio frequency energy, comprising:
    a housing having an upper electrode part in an upper portion thereof, the upper electrode applying the radio frequency energy;
    a chuck assembly which applies the radio frequency energy, fixes a provided wafer, and is installed so as to ascend and descend, opposite to the upper electrode part, inside the housing; and
    a baffle plate which is fixed to an inner wall of the housing so that an inner side edge portion of said baffle plate is positioned adjacent to a side wall of the chuck assembly with a given distance therebetween, wherein said chuck assembly includes:
- a lower electrode closely supporting a center portion of a lower surface of the wafer, an upper surface of the lower electrode part having a stepped shape so that an edge portion thereof confronts and is spaced apart from a lower surface of the wafer;
- a focus ring whose inner lower surface face is closely supported by the stepped shaped upper surface of the lower electrode, and whose inner upper face portion has a stepped shape so that a lower face of the wafer is inserted above and stably positioned thereon; and
- an insulation ring having a ring shape extended and projected outward from a side part of the lower electrode, an inner upper surface portion of said insulation ring having a stepped shape so that a lower face circumferential portion of the focus ring is inserted above and is stably positioned thereon, and wherein an inner upper surface of said insulation ring corresponding to the focus ring is formed so as to be positioned beneath the stepped portion of the lower electrode part, and a corresponding lower portion of said focus ring is formed in a shape projected downwardly along an outer side of the stepped portion of the lower electrode part.

* * * * *